United States Patent
Zhang et al.

(10) Patent No.: US 9,524,933 B2
(45) Date of Patent: Dec. 20, 2016

(54) SEMICONDUCTOR STRUCTURES AND FABRICATION METHODS THEREOF

(71) Applicant: Semiconductor Manufacturing International (Shanghai) Corporation, Shanghai (CN)

(72) Inventors: Haiyang Zhang, Shanghai (CN); Chenglong Zhang, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 14/848,802

(22) Filed: Sep. 9, 2015

(65) Prior Publication Data

US 2016/0118338 A1    Apr. 28, 2016

(30) Foreign Application Priority Data

Oct. 28, 2014    (CN) .......................... 2014 1 0588176

(51) Int. Cl.
*H01L 23/522*    (2006.01)
*H01L 23/532*    (2006.01)
*H01L 21/768*    (2006.01)

(52) U.S. Cl.
CPC ..... *H01L 23/5226* (2013.01); *H01L 21/76879* (2013.01); *H01L 23/53214* (2013.01); *H01L 23/53228* (2013.01); *H01L 23/53257* (2013.01)

(58) Field of Classification Search
CPC .......... H01L 23/5226; H01L 23/53214; H01L 21/76879; H01L 23/53257; H01L 23/53228
See application file for complete search history.

(56) References Cited

U.S. PATENT DOCUMENTS

2016/0005691 A1* 1/2016 Liu .................. H01L 21/76802 257/758

* cited by examiner

*Primary Examiner* — Roy Potter
*Assistant Examiner* — Paul Patton
(74) *Attorney, Agent, or Firm* — Anova Law Group, PLLC

(57) ABSTRACT

A method for forming a semiconductor structure including providing a substrate; forming a dielectric layer covering a surface of the substrate; forming a plurality of first through holes exposing the surface of the substrate by etching the dielectric layer; forming first conductive vias by filling the plurality of first through holes using a first metal material and first conductive lines on the first conductive vias also using the first metal material; forming a plurality of second through holes exposing the surface of the substrate by etching the dielectric layer; and forming second conductive vias by filling the plurality of second through holes using a second metal material, different from the first metal material, and second conductive lines over the second conductive vias also using the second metal material, wherein the second metal material has a different anti-electromigration ability from the first metal material.

18 Claims, 6 Drawing Sheets

SEMICONDUCTOR STRUCTURES AND FABRICATION METHODS THEREOF

CROSS-REFERENCES TO RELATED APPLICATIONS

This application claims the priority of Chinese patent application No. 201410588176.3, filed on Oct. 28, 2014, the entirety of which is incorporated herein by reference.

FIELD OF THE INVENTION

The present invention generally relates to the field of semiconductor manufacturing technology and, more particularly, relates to semiconductor structures and fabrication processes thereof.

BACKGROUND

With the continuous development of ultra-large integration (ULI), the critical dimension (CD) of semiconductor devices has become smaller and smaller. Further, the functionalities of the semiconductor devices have also become broader and broader. The integration level of integrate circuits (ICs) has been developed into a sale where hundreds of millions, or a few billions of devices are integrated in one chip. At the same time, multilayer interconnect techniques utilizing more than two layers of metal interconnect structures have been widely used.

The conventional interconnect structures are usually made of aluminum. With the continuous dimension-shrinking of the semiconductor devices, although the size of interconnect structures is continuously reduced, the electric current passing through the interconnect structures has become larger and larger. Further, the responding time of the interconnect structures are required to be shorter and shorter. Thus, the conventional aluminum interconnect structures are unable to match the desired requirements. Therefore, copper has gradually substituted aluminum in the interconnect structures. Comparing with aluminum, copper has a lower resistivity, and a better anti-electromigration performance. Thus, copper interconnect structures are able to lower the resistance-capacitance (RC) delay of the interconnect structures; improve the anti-electromigration ability; and enhance the reliability of the ICs. Therefore, substituting the aluminum interconnect structures with the copper interconnect structures has become a trend for developmental of the interconnect technology of ICs.

However, as the CMOS devices are scaled to a technical node smaller than 14 nm, the RC delay has attracted more attentions. The resistance in the RC delay significantly depends on the crystal grain size and inherent resistances of the copper interconnect structures. When the critical dimension of the copper interconnect structure is substantially small, the size effects, including the surface and grain boundary scatterings, are expected to dramatically increase the effective resistivity of copper (Cu) interconnects. Moreover, diffusion barriers in the interconnect structure, which are very poor conductors, will take an ever-increasing fraction of the wire volume. Thus, it may increase the resistance of the copper interconnect structures.

Further, the production cost of the copper interconnect structures formed by the existing fabrication processes may be relatively high. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a substrate; and forming a dielectric layer on a surface of the substrate. The method also includes forming a plurality of first through holes exposing the surface of the substrate by etching the dielectric layer using a first patterned mask layer. Further, the method includes forming first conductive vias by filling the plurality of first through holes using a first metal material, and first conductive lines over the first conductive vias also using the first metal material; Further, the method includes forming a plurality of second through holes exposing the surface of the substrate by etching the dielectric layer using a second patterned mask layer; and forming second conductive vias by filling the plurality of second through holes using a second metal material, different from the first metal material, and second conductive lines over the second conductive vias also using the second metal material, wherein the second metal material has a different anti-electromigration ability from the first metal material.

Another aspect of the present disclosure includes a semiconductor structure. The semiconductor structure includes a substrate; and a dielectric layer formed on a surface of the substrate. The semiconductor structure also includes a plurality of first conductive vias made of a first metal material formed on the surface of the substrate in the dielectric layer and a plurality of first conductive lines also made of the first metal material formed on the first conductive vias; and a plurality of second conductive vias made of a second metal material, different from the first metal material formed on the substrate in the dielectric layer and a plurality of second conductive lines also made of the second metal material formed on the second conductive vias, wherein the first metal material has an anti-electromigration ability different from the second metal material.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Usually, the interconnect structures of a semiconductor structure may include signal lines and power lines, etc. Because the resistivity of copper is smaller than the resistivity of tungsten or aluminum, and the anti-electromigration ability of copper is also greater than the anti-electromigration ability of tungsten or aluminum, the signal lines and the power lines are often both made of copper. However, the cost of copper is significantly higher than the cost of tungsten or aluminum.

The DC bias current may be a major reason for causing the electromigration in the interconnect structure. When the DC bias current is higher, the corresponding electric field may be higher; and the electromigration may be more severe. When the semiconductor structure is in operation, the DC currents passing through the power lines are unidirectional currents. Meanwhile, the currents passing through signal lines are bidirectional currents. Thus, the DC bias currents passing through the power lines may be significantly greater than the DC bias currents passing through the signal lines. Comparing with the signals lines, it may be easier to incur the electromigration issue in the power lines. Therefore, it may require the material of the power lines to have a significantly high anti-electromigration ability. The significantly high anti-electromigration ability may be able to prevent the electromigration issue caused by the relatively large DC bias currents. Thus, the power lines may often be made of copper. However, the DC currents in the signal lines may be bidirectional currents. Thus, the effective DC bias currents in the signals lines may be zero, or substantially small; and it may not generate the electromigration issue. That is, signal lines may be immune to the electromigration issue.

Therefore, aluminum or tungsten may be able to match the material requirements of the signal lines. The cost of aluminum or tungsten may be significantly lower than the cost of copper. Thus, aluminum or tungsten may be used as the material of the signal lines; and copper may be used as the material of the power lines. Such a combination may not only ensure the interconnect structure to have desired electrical properties; but also lower the production cost of the semiconductor structure.

Figure 18:
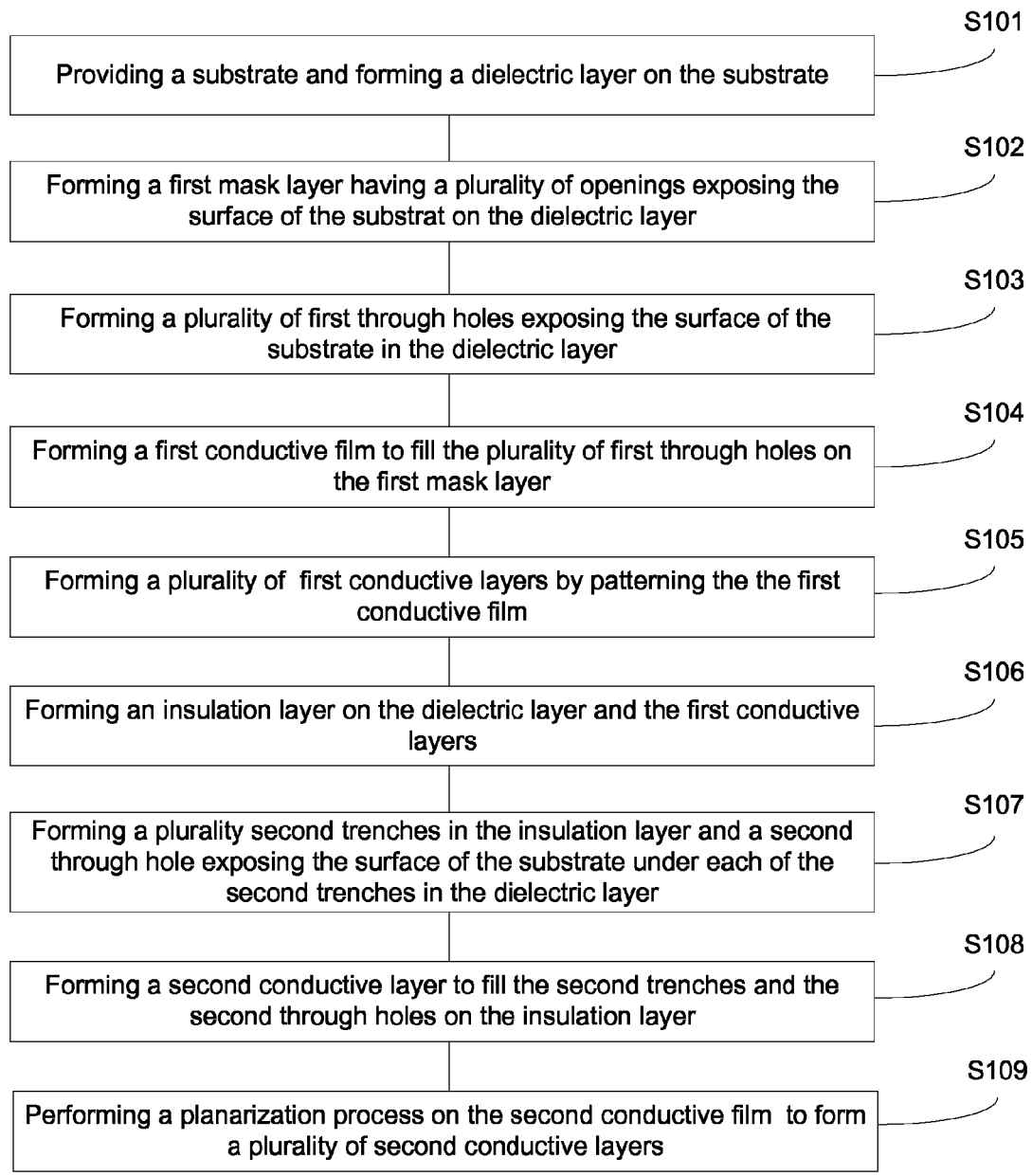
FIG. 18 illustrates an exemplary fabrication process of a semiconductor structure consistent with the disclosed embodiments.

FIG. 18 illustrates an exemplary fabrication process of a semiconductor structure consistent with the disclosed embodiments; and FIGS. 1~9 illustrate semiconductor structures corresponding to certain stages of the exemplary fabrication process.

Figure 1:
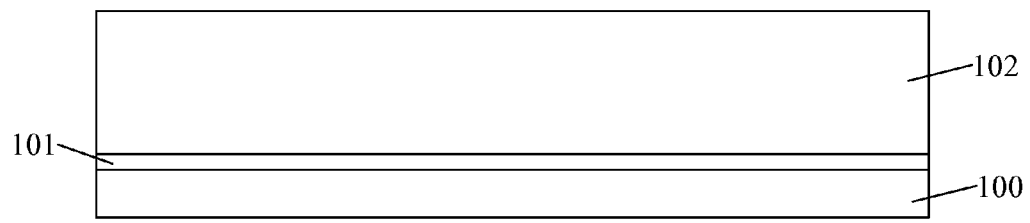
FIGS. 1~9 illustrate semiconductor structures corresponding to certain stages of an exemplary fabrication process of a semiconductor structure consistent with the disclosed embodiments.

As shown in FIG. 18, at the beginning of fabrication process, a substrate with certain structures is provided (S101). FIG. 1 illustrates a corresponding semiconductor structure.

As shown in FIG. 1, a substrate 100 is provided; and a dielectric layer 102 is formed on the surface of the substrate 100. Further, an etching stop layer 101 may be formed between the dielectric layer 102 and the substrate 100.

The substrate 100 may be made of any appropriate semiconductor materials, such as single crystal silicon, polysilicon, silicon on insulator (SOI), silicon germanium, silicon carborundum, indium antimonite, lead telluride, indium arsenide, indium phosphide, gallium arsenide, gallium antimonite, alloy semiconductor, or a combination thereof. The substrate 100 also provides a base for subsequent devices and processes.

Further, a plurality of interface layers, and/or a plurality of strain layers may be formed on the surface of the substrate 100 to improve the performance of the semiconductor structure. Further, a plurality of semiconductor devices may be formed in the substrate 100. The semiconductor devices may include NMOS transistors, PMOS transistors, CMOS transistors, resistors, capacitors, or inductors, etc.

In one embodiment, a first bottom metal layer and a second bottom metal layer may be formed in the substrate 100. The first bottom metal layer may be electrically connected with the subsequently formed first conductive layers. The second bottom metal layer may be electrically connected with the subsequently formed second conductive layers. The first bottom metal layer and the second bottom metal layer may be electrically insulated.

The first bottom metal layer may be made of any appropriate material, such as Cu, Al, or W, etc. The second bottom metal layer may be made of any appropriate material, such as Cu, Al, or W, etc.

The dielectric layer 102 may be subsequently used to electrically insulate the subsequently formed first conductive layers and the subsequently formed second conductive layers. For illustrative purposes, the subsequently formed first conductive layers may be described as the signal lines of the semiconductor structure; and the subsequently formed second conductive layers may be described as the power lines of the semiconductor structure.

The dielectric layer 102 may be made of any appropriate material, such as silicon oxide, silicon nitride, silicon oxynitride, low dielectric constant (low-K) material, or ultra-low-K material, etc. The low-K material may refer to the material having a relative dielectric constant smaller than the relative dielectric constant of the silicon oxide; and greater than 2.5. The ultra-low-K material may refer to the material having a relative dielectric constant smaller than 2.5. The low-K material and the ultra-low-K material may include SiCOH, fluorine-doped silicon oxide (FSG), boron-doped silicon oxide (BSG), boron-phosphor-doped silicon oxide (BPSG), phosphor-doped silicon oxide (PSG), or carbon-doped silicon oxide (black diamond, BD), etc.

In one embodiment, in order to lower the RC delay of the semiconductor structure, low-K material or ultra-low-K material is used for the dielectric layer 102. Various processes may be used to form the dielectric layer 102, such as a chemical vapor deposition (CVD) process, a physical vapor deposition (PVD) process, an atomic layer deposition (ALD) process, or a flowable CVD (FCVD) process, etc.

In order to prevent the subsequent process for etching dielectric layer 102 from damaging the surface of the substrate 100, referring to FIG. 1, the etching stop layer 101 may be formed on the surface of the substrate 100; and the dielectric layer 102 may be formed on the surface of the etching stop layer 101. The subsequent process for etching the dielectric layer 102 may have a relatively large etching selectivity between the dielectric layer 102 and the etching stop layer 101. Thus, it may prevent the surface of the substrate 100 from being etched by the process for etching the dielectric layer 102.

The etching stop layer 101 may be made of a material different from the material of the dielectric layer 102. Such a material may include one or more of silicon nitride, silicon carbide, silicon oxynitride, silicon oxycarbide, silicon nitrocarbide, etc. Various processes may be used to form the etching stop layer 101, such as a CVD process, a PVD process, an ALD process, or an FCVD process, etc.

Figure 2:
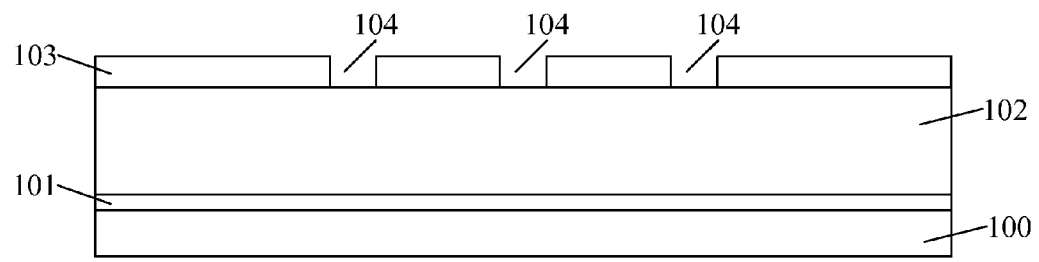

Returning to FIG. 18, after providing the substrate 100 and forming the dielectric layer 102, a first mask layer may be formed (S102). FIG. 2 illustrates a corresponding semiconductor structure.

As shown in FIG. 2, a first mask layer 103 is formed on the surface of the dielectric layer 102. The first mask layer 103 may have a plurality of first openings 104; and the plurality of first openings 104 may expose the surface of the dielectric layer 102. The first mask layer 103 may define the positions and the size of the subsequently formed first through holes, i.e., the holes penetrating through the dielectric layer 102. The first through holes may be subsequently formed by etching through portions of the dielectric layer 102 using the first mask layer 103 as an etching mask.

The first mask layer 103 may be made of any appropriate material, such as one or more of silicon oxide, silicon nitride, silicon oxynitride, photoresist material, or metal material, etc. The metal material may include TiN or TaN, etc. The first mask layer 103 may be a single layer structure, or a multiple-layer structure. In one embodiment, the first mask layer 103 is a single layer structure made of silicon nitride. Silicon nitride may have a desired etching selectivity with the material of the dielectric layer 102.

A process for forming the first mask layer 103 may include, sequentially, forming a first mask film (not shown) on the dielectric layer 102; forming a patterned photoresist layer having the patterns corresponding to the first openings 104 on the first mask film; etching the portions of the dielectric layer 102 using the pattern photoresist layer as an etching mask to form the plurality of first openings 104; and removing the patterned photoresist layer. Thus, the plurality of first openings 104 may be formed.

The first mask film may be formed by any appropriate process, such as a CVD process, a PVD process, or an ALD process, etc. The first mask film may be etched by any appropriate process, such as a dry etching process, a wet etching process, or an ion beam etching process, etc. The patterned photoresist layer may be removed by any appropriate process, such as a dry etching process, a wet etching process, or an ion beam etching process, etc.

Figure 3:
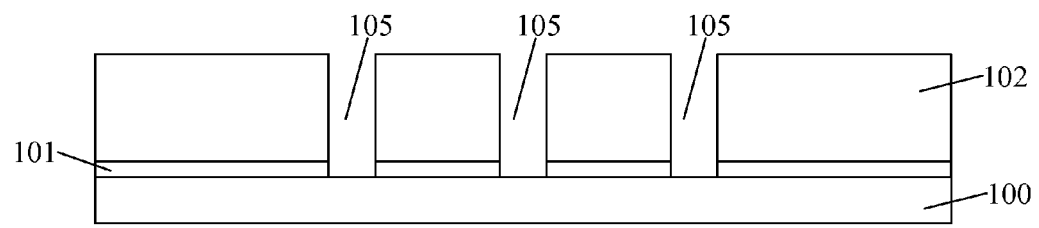

Returning to FIG. 18, after forming the first mask layer 103, a plurality of first through holes may be formed (S103). FIG. 3 illustrates a corresponding semiconductor structure.

As shown in FIG. 3, a plurality of first through holes 105 are formed in the dielectric layer 102. The first through holes 105 refers to the holes penetrating through the dielectric layer 102. The first through holes 105 may also penetrate through the etching stop layer 101. Further, the first through holes 105 may expose the surface of the substrate 100.

The first through holes 105 may be formed by etching the dielectric layer 102 along the first openings 104 until the surface of the substrate 100 is exposed. The dielectric layer 102 may be etched by any appropriate process, such as dry etching process, a wet etching process, or an ion beam etching process, etc. In one embodiment, the dielectric layer 102 is etched by a dry etching process.

The etching stop layer 101 may be formed between the dielectric layer 102 and the surface of the substrate 100. Thus, after etching through the dielectric layer 102 by the dry etching process, the etching stop layer 101 may be further etched to expose the surface of the substrate 100. Therefore, the surface of the substrate 100 exposed by the first through holes 105 may be protected by the etching stop layer 101 from over-etching during the etching process.

Further, after forming the first through holes 105, the first mask layer 103 may be removed. The first mask layer 103 may be removed by any appropriate process, such as a dry etching process, or a wet etching process, etc. In one embodiment, the first mask layer 103 is made of silicon nitride, and a wet etching process may be used to remove the first mask layer 103. The etching solution of the wet etching process may be a phosphoric acid solution. The mass percentile of phosphoric acid in de-ionized water may be in a range of the approximately 65%~85%. The temperature of the phosphoric solution may be in a range of approximately 80° C.~200° C.

Figure 4:
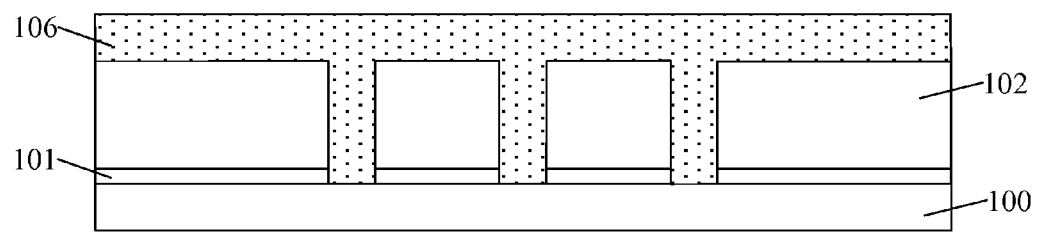

Returning to FIG. 18, after forming the plurality of first through holes 105, a first conductive film may be formed (S104). FIG. 4 illustrates a corresponding semiconductor structure.

As shown in FIG. 4, a first conductive film 106 is formed on the surface of the dielectric layer 102. Further, the first conductive film 106 may also fill the plurality of first through holes 105.

The first conductive film 106 may be used to subsequently form first conductive structures. The first conductive structures may be configured as the signal lines of the semiconductor structure. When the semiconductor structure is in operation, the DC bias current passing through the first conductive structures may be significantly small. Such small DC bias current may be unable to cause the electromigration in the signal lines. Thus, it may unnecessarily require that the subsequently formed first conductive structures to have a significantly high anti-electromigration ability. Therefore, aluminum or tungsten, etc., may match the material requirements of signal lines.

Therefore, in one embodiment, the first conductive film 106 may be made of aluminum, or tungsten, etc. Comparing with copper, the cost of aluminum or tungsten may be relatively low. Thus, it may effectively reduce the production cost of the interconnect structure without adversely affecting the electrical properties of the interconnect structure.

The process for forming the first conductive film 106 may be also be referred as an Al/W gap filling process. Various processes may be used to form the first conductive film 106, such as a CVD process, a PVD process, an ALD process, a metal-organic CVD (MOCVD) process, or a sputtering process, etc. In one embodiment, the first conductive film 106 is made of aluminum; and a sputtering process is used to form the first conductive film 106. The target of the sputtering process is aluminum. The sputtering gas may be Ar, etc. The flow rate of Ar may be in a range of approximately 20 sccm~200 sccm. The sputtering power may be in a range of approximately 100 W~3500 W.

In one embodiment, the thickness of the first conductive film 106 may be greater than the thickness of the subsequently formed first conductive layers. Thus, after forming the first conductive film 106, a planarization process may be performed on the first conductive film 106. The planarization process may cause the first conductive film 106 to have a predetermined thickness which will match the thickness of the subsequently formed first conductive layers. The planarization process may be a chemical mechanical polishing (CMP) process, or a physical mechanical polishing process, etc.

Figure 5:
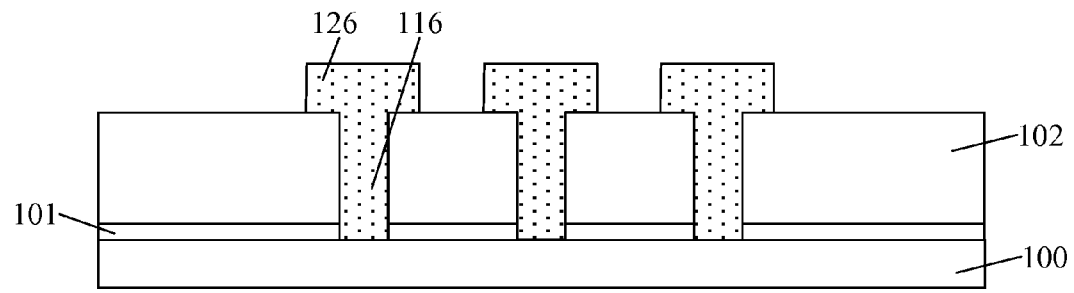

Returning to FIG. 18, after forming the first conductive film 106, a plurality of first conductive layers may be formed (S105). FIG. 5 illustrates a corresponding semiconductor structure.

As shown in FIG. 5, a first conductive structure (not labeled) is formed in each of the first through holes 105. Each of the first conductive structures may include a first conductive via 116 formed in the first through hole 105; and a first conductive line 126 covering the top surface of the first conductive via 116 and a portion of the surface of the dielectric layer 102. The first conductive vias 116 may be used to electrically connect the first conductive structures with the devices in the substrate 100. The first conductive lines 126 may be used to electrically connect the first conductive vias 116 with the subsequently formed metal layer; and/or other devices.

The first conductive structures may be configured as the signal lines of the semiconductor structure. When the semiconductor structure is in operation, the DC bias current passing through the signal lines may be substantially small. Thus, the DC bias current may not cause the electromigration in the first conductive layers. Therefore, it may unnecessarily require the material of the first conductive structures to have a significantly high anti-electromigration ability. That is, aluminum or tungsten may be able to match the material requirements of the first conductive structures.

In one embodiment, the first conductive structures may be made of aluminum or tungsten. Comparing with the first conductive structures made of copper, the cost of the first structures made of aluminum or tungsten may be relatively low. Thus, the production cost of the semiconductor structure having such first conductive structures may be reduced.

The first conductive structures may be formed by patterning the first conductive film 106. The patterning process may include forming a first patterned mask layer on the first conductive film 106. The first patterned mask layer may cover the portions of the surface of the first conductive film 106 corresponding to the subsequently formed first conductive lines 126. Further, the patterning process may include etching the first conductive film 106 until the surface of the dielectric layer 102 is exposed. Thus, the first conductive lines 126 may be formed on the first conductive vias 116. The first conductive lines 126 may also cover a portion of the surface of the dielectric layer 102. After forming the first conductive lines 126, the first patterned mask layer may be removed.

In one embodiment, the first conductive structures are made of aluminum. Thus, such a process for forming the first conductive layers may be refereed as an Al subtractive patterning process. Comparing with the conventional damascene process, the grain size of the first conductive structures formed by the subtractive patterning process may be relatively large. Thus, the grain boundary scattering may be reduced; and the resistivity of the first conductive structures may be reduced. Therefore, the electrical properties of the first conductive structures may be improved; and the performance of the semiconductor structure may be enhanced.

The first patterned mask layer may be made of a material different from the material of the dielectric layer 102. Thus, the first patterned mask layer and the dielectric layer 102 may have an etching selectivity. When the first patterned mask layer is removed, the process for removing the first patterned mask layer may not damage the dielectric layer 102. In one embodiment, the dielectric layer 102 is made of silicon oxide; and the first patterned mask layer is made silicon nitride.

Various processes may be used to etch the first conductive film 106, such as a dry etching process, a wet etching process, or an ion beam etching process, etc. In one embodiment, the first conductive film 106 is etched by a dry etching process to form the first conductive lines 126.

Figure 6:
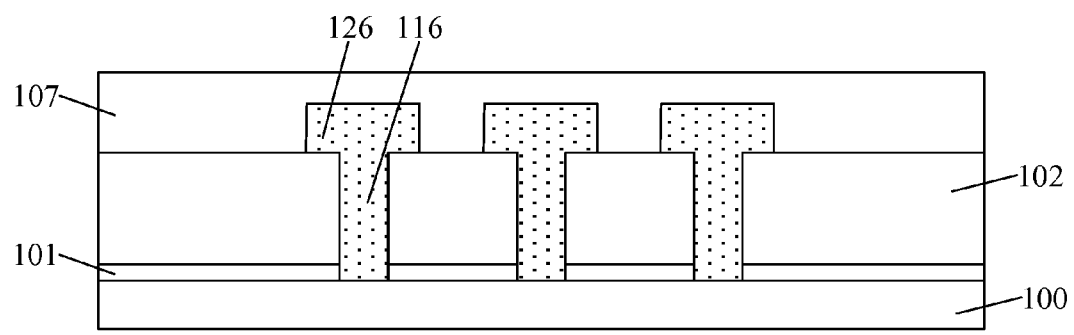

Returning to FIG. 18, after forming the first conductive structures, an insulation layer may be formed (S106). FIG. 6 illustrates a corresponding semiconductor structure.

As shown in FIG. 6, an insulation layer 107 is formed on the surface of the dielectric layer 102. The insulation layer 107 may also cover the side and top surfaces of the first conductive lines 126. The insulation layer 107 may be used to electrically insulate adjacent first conductive lines 126. Further, the insulation layer 107 may be also used to electrically insulate the first conductive lines 126 and the subsequently formed second conductive lines.

The insulation layer 107 may also provide a process base for subsequently forming the second conductive lines. Specifically, second trenches may be subsequently formed in the insulation layer 107 by etching the insulation layer 107. Further, second throughholes may be subsequently formed in the dielectric layer 102. The second through holes and the second trenches may run through each other. Further, the width of the second trenches may be greater than the width of the second through holes. Then, second conductive vias may be subsequently formed in the second throughholes; and second conductive lines may be formed in the second trenches.

The insulation layer 107 may be made of any appropriate material, such as silicon oxide, silicon nitride, silicon oxynitride, low-K material, or ultra-low-K material, etc. In one embodiment, the insulation layer 107 is made of carbon-doped silicon oxide (black diamond, BD).

Various processes may be used to form the insulation layer 107, such as a CVD process, a PVD process, or an FCVD process, etc. In one embodiment, the insulation layer is formed by a spin-coating process. Thus, the insulation layer 107 may also be referred as a spin-on black diamond (spin-on BD) layer.

After subsequently forming a second conductive film on the insulation layer 107, a chemical mechanical polishing (CMP) process may be performed on the second conductive film to form second conducive structures. Referring to FIG. 6, in order to prevent the CMP process from damaging the first conductive lines 126, in one embodiment, the insulation layer 107 covers the top surfaces of the first conductive lines 126. In certain other embodiments, the top surface of the insulation layer 107 may level with the top surfaces of the first conductive lines 126. When the top surfaces of the first conductive lines 126 are exposed, the CMP process may be stopped.

Figure 7:
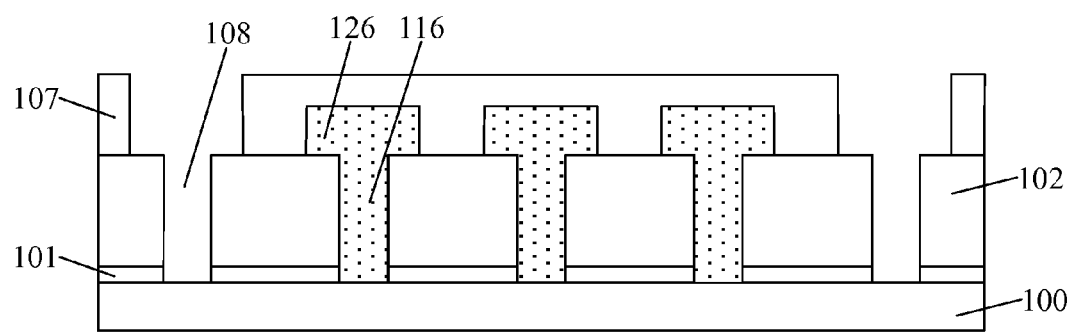

Returning to FIG. 18, after forming the insulation layer 107, a plurality of second trenches and a plurality of second throughholes may be formed (S107). FIG. 7 illustrates a corresponding semiconductor structure.

As shown in FIG. 7, a plurality of second trenches (not labeled) are formed in the insulation layer 107; and a plurality of second throughholes 108 are formed in the dielectric layer 102. The second through holes 108 refer to the holes penetrating through the dielectric layer 102. The second through holes 108 are formed on the bottom of the second trenches; and the second through holes 108 may run through the second trenches. Further, the width of the second trenches may be greater than the width of the second through holes 108.

The second through holes 108 may run through the second trenches. Thus, the second through holes 108 and the second trenches may provide a process base for subsequently forming second conductive structures. Specifically, each of the second conductive structures may include a second conductive via, and a second conductive line. The second conducive via may be formed in the second through hole 108; and the second conductive line may be formed in the second trench. For illustrative purpose, the bottom surfaces of the second trenches may level with the top surfaces of the first conductive vias 116. That is, the bottom surfaces of the subsequently formed second conductive lines may level with the bottom surfaces of the first conductive lines 126.

A process for forming the second through holes 108 and the second trenches may include forming a first patterned photoresist layer on the surface of the insulation layer 107. The first patterned photoresist layer may determine the size and the positions of the second trenches. Further, the process may include etching the insulation layer 107 using the patterned first photoresist layer as an etching mask until the top surface of the dielectric layer 102 is exposed. Thus, the second trenches may be formed in the insulation layer 107. Further, the process may also include removing the first patterned photoresist layer; and forming a second patterned photoresist layer on the bottom surfaces of the second trenches. Further, the process may also include etching the dielectric layer 102 using the second patterned photoresist layer as an etching mask until the surface of the substrate 100 is exposed. Thus, the second through holes 108 may be formed; and the second through holes 108 may run through second trenches. Further, the second through holes 108 may expose the surface of the substrate 100. After forming the second through holes 108, the second patterned photoresist layer may be removed.

In certain other embodiments, the bottom surfaces of the second trenches may be lower than the top surfaces of the first conductive vias 116. That is, the second trenches may penetrate through the insulation 107 and a portion of the dielectric layer 102; and the second through holes 108 may penetrate through the remained portion of the dielectric layer 102. Thus, the top surfaces of the subsequently formed second conductive vias may be lower the top surfaces of the first conductive vias 116.

In still certain other embodiments, the bottom surfaces of the second trenches may be higher than the top surfaces of the first conductive vias 116. That is, the second trenches may penetrate into a portion of the insulation layer 107; and the second through holes 108 may penetrate through the remaining portion of the insulation layer 107; and the entire dielectric layer 102. Thus, the top surfaces of the subsequently formed second conductive vias may be higher than the top surfaces of the first conductive vias 116.

The second trenches may be formed by any appropriate etching process, such as a dry etching process, a wet etching process, or an ion beam etching process, etc. The second through holes 108 may be formed by any appropriate process, such as a dry etching process, or a wet etching process, etc. The first patterned photoresist layer and the second patterned photoresist layer may be removed by any appropriate process, such as a dry etching process, a wet etching process, or a plasma ashing process, etc.

Figure 8:
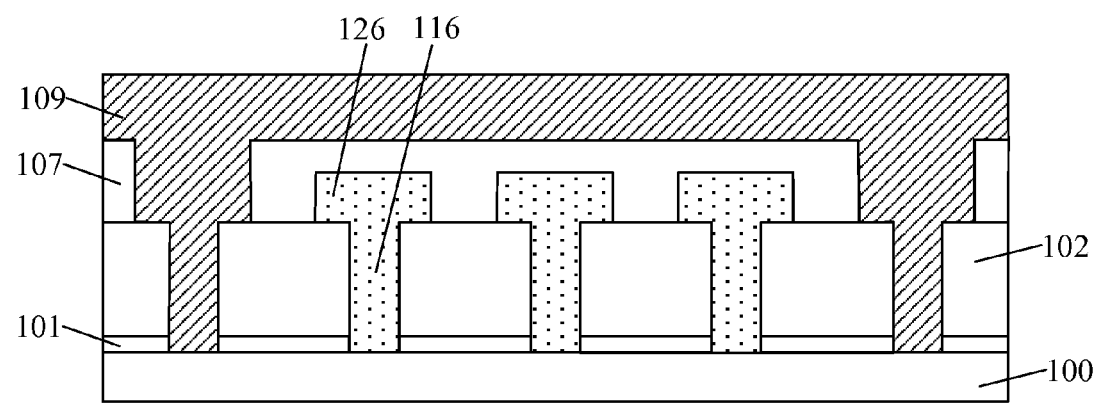

Returning to FIG. 18, after forming the second trenches and the second through holes 108, a second conducive film may be formed (S108). FIG. 8 illustrates a corresponding semiconductor structure.

As shown in FIG. 8, a second conductive film 109 may be formed. The second conductive film 109 fills the second through holes 108 and the second trenches. The second conductive film 109 also covers the top surface of the insulation layer 107.

The second conductive film 109 may provide a process base for subsequently formed second conductive structures. Specifically, a CMP process may be subsequently performed on the second conductive film 109 to expose the surfaces of the first conductive lines 126. The portions of the second conductive film 109 in the second through holes 108 may be configured as second conductive vias; and the portions of the second conductive film 109 in the second trenches may be configured as the second conductive lines. The second conductive lines and the second conductive vias may form the second conductive structures.

The subsequently formed second conductive layers may be configured as the power lines of the semiconductor structure. When the semiconductor structure is in operation, the DC bias current passing through the power lines may be relatively large. Such a relative large DC bias current may cause the electromigration in the power lines to become significant. Thus, it may require the material of the second conductive film 109 to have a relatively high anti-electromigration ability. Comparing with aluminum or tungsten, copper has a relatively high anti-electromigration ability. Thus, in one embodiment, the second conductive film 109 may be made of copper. Therefore, the subsequently formed second conductive layers may also be made of copper.

The second conductive film 109 may be formed by any appropriate process, such as a CVD process, a PVD process, an FCVD process, or an electroplating process. In one embodiment, the second conductive film 109 is formed by a flowable PVD process. Specifically, an amber PVD process is used to form the second conductive film 109. In the amber PVD process, under the capillary action, copper may be sucked into the second conductive through holes 108; and may reach the bottoms of the second through holes 108. Thus, the copper in the second through holes 108 may fill the second through holes 108 with a bottom-up mode, and without defects. Therefore, it may avoid forming voids and defects on the bottom of the second through holes 108.

Further, because the copper may fill the second through holes 108 with a bottom-up mode, the openings of the second trenches may be kept open during the process for forming the second conductive film 109. Thus, it may avoid forming voids in the second conductive film 109. Further, a smaller size of the second through holes 108 may have a more obvious capillary action. The more obvious capillary action may cause the copper filled the second conductive vias 108 to have a better quality. Thus, it may match the requirements for the device miniaturization.

Referring to FIG. 8, an amber PVD process may include forming a copper film on the dielectric layer 107; and performing a reflowing process to cause the copper to flow to the bottoms of the second through holes 108 under the capillary action until the second through holes 108 are filled. Thus, the second conductive film 109 is formed.

In the amber PVD process, the higher the process temperature is, the higher surface mobility of the copper film is. Thus, it may aid to cause the copper crystal grains to migrate into bigger crystal grains. That is, the crystal grains of the second conductive film 109 may be relatively large. Thus, the grain boundaries of the copper crystal grains in the second conducive film 109 may be reduced; and the crystal boundary scattering may be reduced. Reducing the crystal boundary scattering may reduce the resistivity of the subsequently formed second conductive structures. Further, the higher the process temperature is, the more significant the diffusion of the copper atoms in the second conductive film 109 is; and the stronger the capillary action is. Thus, the growth rate of the copper in the second through holes 108 and the second trenches may be increased.

If the process temperature of the amber PVD process is substantially low, copper crystal grains of the second conducive film 109 may be relatively small. Thus, it may affect the quality of the second conducive film 109. If the process temperature of the amber PVD process is significantly high, the copper crystal grains of the second conductive film 109 may be relatively large. It may cause a weak bonding between copper crystal grains. Thus, it may reduce the density of the second conductive film 109. Further, the resistivity of the second conductive film 109 may be increased; and the anti-electromigration ability may be reduced.

Therefore, in one embodiment, the process temperature of the amber PVD process may be in a range of approximately 250° C.~400° C. Such a temperature may ensure the crystal grains of the second conductive film 109 to have a desired growth rate. Further, the bonding force between adjacent crystal grains may be increased; the resistivity of the second conductive film 109 may be decreased; and the anti-electromigration ability of the second conductive film 109 may be increased. When the process temperature of the amber PVD process is in a range of approximately 300° C.~350° C., the subsequently formed second conductive structures having second conductive vias and second conductive lines may have optimized electrical properties.

Figure 9:
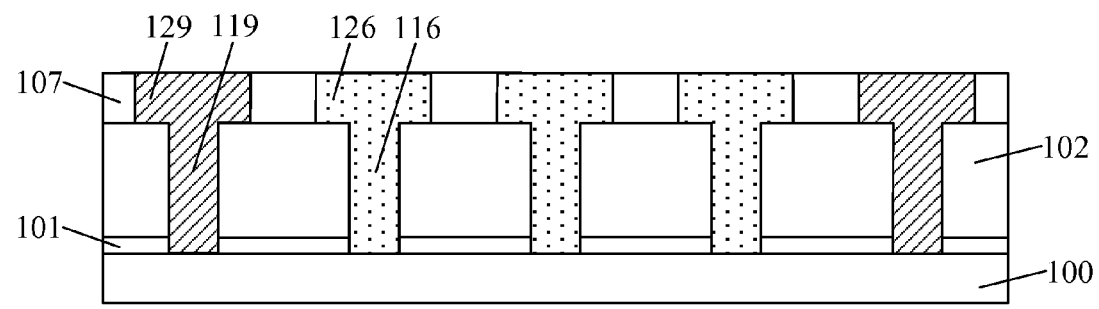

Returning to FIG. 18, after forming the first conductive film 109, a planarization process may be performed on the first conductive film 109 (S109). FIG. 9 illustrates a corresponding semiconductor structure.

As show in FIG. 9, the surface of the second conductive film 109 and the insulation layer 107 are planarized; and the top surface of the first conductive lines 126 are exposed. The second conductive vias 119 are formed in the second through holes 108. Further, the second conductive lines 129 may be formed in the second trenches. A second conductive via 119 and the second conductive line 129 formed on the second conductive via 119 may form a second conductive structures. Further, the second conductive line 129 may also cover a portion of the surface of the dielectric layer 102.

In one embodiment, the second conductive structures may be configured as the power lines of the semiconductor structure; and the first conductive structures may be configured as the signal lines of the semiconductor structure. Thus, the anti-electromigration ability of the second conductive structures and the anti-electromigration ability of the first conductive structures may be different. The power lines of the semiconductor structure may be significantly affected by the DC bias current when the semiconductor structure is in operation. The DC bias current may cause an electromigration issue. Thus, it may require the material of the second conductive layers to have a relatively large anti-electromigration ability such that the electromigration caused by the DC bias current may be avoided.

Therefore, in one embodiment, the second conductive layers may be made of copper. That is, the second conductive vias 119 may be made of copper; and the second conducive lines 129 may be made of copper. The second conductive vias 119 may be formed by an amber PVD. Thus, copper may fill the second through holes 108 with a bottom-up mode. Therefore, voids and defects may be prevented from being formed in the second conductive vias 119; and the quality of the second conductive vias 119 may be improved. Further, the second conductive lines 129 may also be formed by the amber PVD process. Thus, the quality of the second conductive lines 129 may be as desired.

The planarization process may be any appropriate process, such as a chemical mechanical polishing (CMP) process, or a physical mechanical polishing process, etc. In one embodiment, a CMP process is used to planarize the second conductive film 109. The CMP process may remove the portion of the second conductive film 109 higher than the first conductive lines 126, and the portion of the insulation layer 107 higher than the first conductive lines 126. Thus, referring to FIG. 9, the surfaces of the second conductive lines 129 may level with the surfaces of the first conductive lines 126 and the top surface of the insulation layer 107. The second conductive vias 119 and the second conductive lines 129 may be formed by the amber PVD process under the capillary action. The quality of the second conductive vias 119 and the second conductive lines 129 may be relatively high; and voids and defects may be avoided.

The process for forming such second conductive structures may be referred as a dual-damascene (DD) process. That is, the second conductive structures are formed by forming a copper film filling the second trenches and the second through holes 108; and followed by a CMP process to remove a top portion of the copper to form the second conductive structures.

In one embodiment, the first conductive structures may be formed first; and the first conductive structures may be configured as the signal lines of the semiconductor structure. Then, the second conductive structures may be formed; and the second conducive structures may be configured as the power lines of the semiconductor structure. In certain other embodiments, the second conductive structures may be formed first; and the second conductive structures may be configured as the power lines of the semiconductor structure. Then, the first conductive structures may be formed; and the first conductive structures may be configured as the signal lines of the semiconductor structure. The first conductive structures may be made of aluminum or tungsten; and the second conductive structures may be made of copper.

Thus, a semiconductor structure may be formed by the above disclosed processes and methods; and the corresponding semiconductor structure is illustrated in FIG. 9. As shown in FIG. 9, the semiconductor structure includes a substrate 100; and a dielectric layer 102 formed on the surface of the substrate 100. The semiconductor structure may also include an etching stop layer 101 formed between the dielectric layer 102 and the surface of the substrate 100; and an insulation layer 103 formed on the dielectric layer 102. Further, the semiconductor structure may include a plurality of first conductive vias 116 formed on the surface of the substrate 100 in the dielectric layer 102; and a first conductive line 126 formed on each of the first conductive vias 126 in the insulation layer 107.

Further, the semiconductor structure may also include a plurality of second conductive vias 119 formed on the surface of the substrate 100 in the dielectric layer 102; and a second conductive line 129 formed on each of the second conductive vias 119 in the insulation layer 107. Each of the first conductive vias 116 and the first conductive line 126 formed on the first conductive via 116 may form a first conducive structure. Each of the second conductive vias 119 and the second conductive line 129 formed on the second conductive via 119 may form a second conducive structure. The first conductive structures may be made of a material with an anti-electromigration ability different from that of the material of the second conductive structures. The detailed structures and intermediate structures are described above with respect to the fabrication processes.

The first conductive structures may be used to electrically connect the devices in the substrate 100 with other devices. In order to cause the first conductive structures and other devices to have a relatively large connect area, in one embodiment, a first conductive structure may include a first conductive via 116 and a second conductive line 126 formed on the first conductive via 116. The first conductive line 126 may also cover a portion of the dielectric layer 102. The size of the top surfaces of the first conductive lines 126 may be greater than the size of the top surfaces of the first conductive vias 116. Thus, it may cause the first conductive structures to be easy to electrically connect with other devices.

The second conductive structures may also be used to connect the devices in the substrate 100 with other devices. Correspondingly, in order to cause the second conductive structures and the other devices to have a relatively large contact area, in one embodiment, a second conductive structure may include a second conductive via 119 and a second conductive line 129 formed on the second conductive via 119. The size of the top surfaces of the second conductive lines 129 may be greater than the size of the top surfaces of the second conductive vias 119. Thus, it may cause the second conductive structures to be easy to electrically connect with the other devices.

The insulation layer 107 may be used to prevent the first conductive lines 126 and the second conductive lines 129 from electrically connecting with the regions which are not supposed to be connected. Further, the insulation layer 107 may also prevent the external environment to adversely affect the first conductive lines 126 and the second conductive lines 129. Further, the insulation layer 107 may also be able to prevent the electrical connection between adjacent first conductive lines 126, between adjacent second conductive lines 129; and between the first conductive lines 126 and the second conductive lines 129.

FIGS. 10~17 illustrate semiconductor structures corresponding to certain stages of another exemplary fabrication process of a semiconductor structure consistent with the disclosed embodiments.

Figure 10:
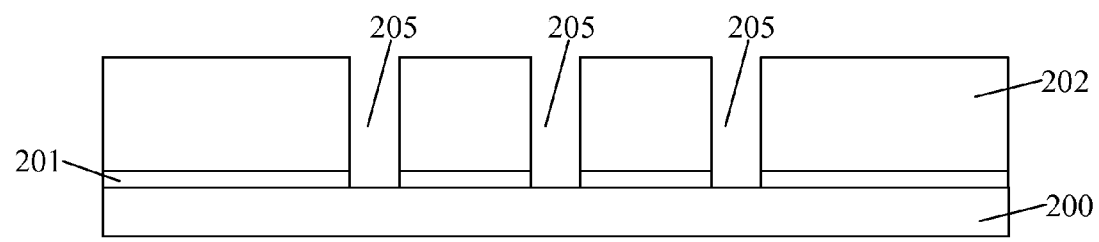
FIGS. 10~17 illustrate semiconductor structures corresponding to certain stages of another exemplary fabrication process of a semiconductor structure consistent with the disclosed embodiments.

As shown in FIG. 10, at the beginning of the fabrication process, a substrate 200 is provided; and a dielectric layer 202 is formed on the surface of the substrate 200. Further, in one embodiment, an etching stop layer 201 is formed on the surface of the substrate 200; and the dielectric layer 202 is formed on the surface of the etching stop layer 201. Further, a plurality of first through holes 205 are formed in the dielectric layer 202. The first through holes 205 refer to the holes penetrating through the dielectric layer 202.

The substrate 200 may be made of any appropriate semiconductor materials, such as single crystal silicon, polysilicon, silicon on insulator (SOI), silicon germanium, silicon carborundum, indium antimonite, lead telluride, indium arsenide, indium phosphide, gallium arsenide, gallium antimonite, alloy semiconductor, or a combination thereof. The substrate 200 provides a base for subsequent devices and processes.

Further, a plurality of interface layers and/or a plurality of strain layers (not shown) may be formed on the surface of the substrate 200 to improve the performance of the semiconductor structure. Further, a plurality of semiconductor devices (not shown) may be formed in the substrate 200. The semiconductor devices may include NMOS transistors, PMOS transistors, CMOS transistors, resistors, capacitors, or inductors, etc.

In one embodiment, a first bottom metal layer and a second bottom metal layer (not shown) may be formed in the substrate 200. The first bottom layer may be electrically connected with the subsequently formed first conductive layers. The second bottom metal layer may be electrically connected with the subsequently formed second conductive layers. The first bottom metal layer and the second bottom metal layer may be electrically insulated.

The first bottom metal layer may be made of any appropriate material, such as Cu, Al, or W, etc. The second bottom metal layer may be made of any appropriate material, such as Cu, Al, or W, etc.

The dielectric layer 202 may be subsequently used to electrically insulate the subsequently formed first conductive structures and the subsequently formed second conductive structures. For illustrative purposes, the subsequently formed first conductive structures may be described as the signal lines of the semiconductor structure; and the subsequently formed second conductive structures may be described as the power lines of the semiconductor structure.

The dielectric layer 202 may be made of any appropriate material, such as silicon oxide, silicon nitride, silicon oxynitride, low-K material, or ultra-low-K material, etc. The low-K material and the ultra-low-K material may include SiCOH, fluorine-doped silicon oxide (FSG), boron-doped silicon oxide (BSG), boron-phosphor-doped silicon oxide (BPSG), phosphor-doped silicon oxide (PSG), or carbon-doped silicon oxide (black diamond), etc.

In one embodiment, in order to lower the RC delay of the semiconductor structure, low-K material or ultra-low-K material is used for the dielectric layer 202. Various processes may be used to form the dielectric layer 202, such as a CVD process, a PVD process, an ALD process, or an FCVD process, etc.

In order to prevent the subsequent process for etching dielectric layer 202 from damaging the surface of the substrate 200, referring to FIG. 10, the etching stop layer 201 may be formed between the surface of the substrate 200 and the dielectric layer 202. The subsequent process for etching the dielectric layer 202 may have a large etching selectivity between the dielectric layer 202 and the etching stop layer 201. Thus, it may prevent the surface of the substrate 200 from being etched by the subsequent process for etching the dielectric layer 202.

The etching stop layer 201 may be made of a material different from the material of the dielectric layer 202. Such material may include one or more of silicon nitride, silicon carbide, silicon oxynitride, silicon oxycarbide, silicon nitrocarbide, etc. Various processes may be used to form the etching stop layer 201, such as a CVD process, a PVD process, an ALD process, or an FCVD process, etc.

Further, referring to FIG. 10, after providing the substrate 200 and forming the dielectric layer 202, the plurality of first through holes 205 may be formed. The first through holes 205 may be formed by etching the dielectric layer 202 until the surface of the substrate 200 is exposed.

A process for forming the plurality of first through holes 205 may include forming a first patterned mask layer (not shown) on the dielectric layer 202. The first patterned mask layer may have patterns corresponding to the size and positions of the first through holes 205. Then, the dielectric layer 202 may be etched until the surface of the etching stop layer 201 exposed. Further, the etching stop layer 201 may be further etched to expose the surface of the substrate 200. Thus, the plurality of first through holes 205 may be formed.

The first patterned mask layer may be made of any appropriate material, such as one or more of silicon oxide, silicon nitride, silicon oxynitride, photoresist material, or metal material, etc. The metal material may include TiN, or TaN, etc. The first patterned mask layer may be a single layer structure, or a multiple-layer structure. In one embodiment, the first patterned mask layer is a single layer structure made of silicon nitride. Silicon nitride may have a desired etching selectivity with the dielectric layer 202.

The dielectric layer 202 may be etched by any appropriate process, such as dry etching process, a wet etching process, or an ion beam etching process, etc. In one embodiment, the dielectric layer 202 is etched by a dry etching process. The etching stop layer 201 may be formed between the dielectric layer 202 and the surface of the substrate 200. Thus, after etching through the dielectric layer 202 by the dry etching process, the etching stop layer 201 may be further etched to expose the surface of the substrate 200.

Further, after forming the first through holes 205, the first patterned mask layer may be removed. The first patterned mask layer may be removed by any appropriate process, such as a dry etching process, or a wet etching process, etc.

In one embodiment, the first patterned mask layer is made of silicon nitride. Thus, a wet etching process may be used to remove the first patterned mask layer. The etching solution of the wet etching process may be a phosphoric acid solution. The mass percentile of phosphoric acid in de-ionized water may be in a range of the approximately 65%~85%. The temperature of the phosphoric solution may be in a range of approximately 80° C.~200° C.

Figure 11:
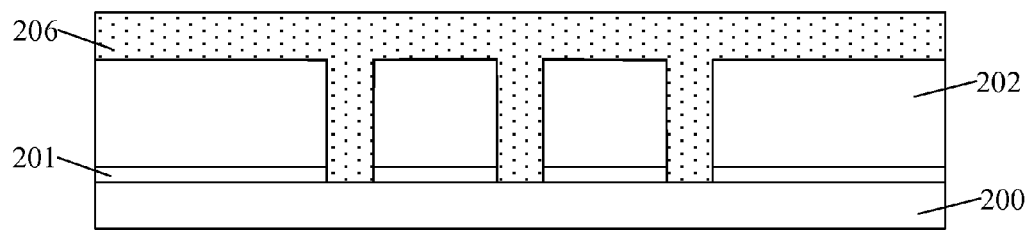

Further, as shown in FIG. 11, after forming the plurality of first through holes 205, a first initial conductive film 206 may be formed. The first initial conductive film 206 is formed on the surface of the dielectric layer 202. Further, the first initial conductive film 206 may also fill the plurality of first through holes 205.

The first initial conductive film 206 may be used to subsequently form first conductive vias. The portion of the first conductive film 206 on the surface of the dielectric layer 202 may be subsequently removed. Thus, the first conductive vias may be formed in the first through holes 205. The first conductive vias may be configured as portions of the subsequently formed first conductive structures.

The first conductive structures may be configured as the signal lines of the semiconductor structure. When the semiconductor structure is in operation, the DC bias current passing through the first conductive structures may be relatively small. Such small DC bias current may be unable to adversely affect the electromigration of the signal lines. Thus, it may unnecessarily require the subsequently formed first conductive structures to have a significantly high anti-electromigration ability. Therefore, aluminum or tungsten, etc., may match the material requirement of the signal lines.

Therefore, in one embodiment, the first initial conductive film 206 may be made of aluminum, or tungsten, etc. Comparing with copper, the cost of aluminum or tungsten may be relatively low. Thus, it may effectively reduce the production cost of the interconnect structure without adversely affecting the electrical properties of the interconnect structure.

The process for forming the first initial conductive film 206 may be referred an Al/W gap filling process. Various processes may be used to form the first initial conductive film 206, such as a CVD process, a PVD process, an ALD process, a metal-organic CVD (MOCVD) process, or a sputtering process, etc. In one embodiment, the first initial conductive film 206 is made of aluminum; and a sputtering process is used to form the first initial conductive film 206. The target of the sputtering process is aluminum. The sputtering gas may be Ar, etc. The flow rate of Ar may be in a range of approximately 20 sccm~200 sccm. The sputtering power may be in a range of approximately 100 W~3500 W.

Figure 12:
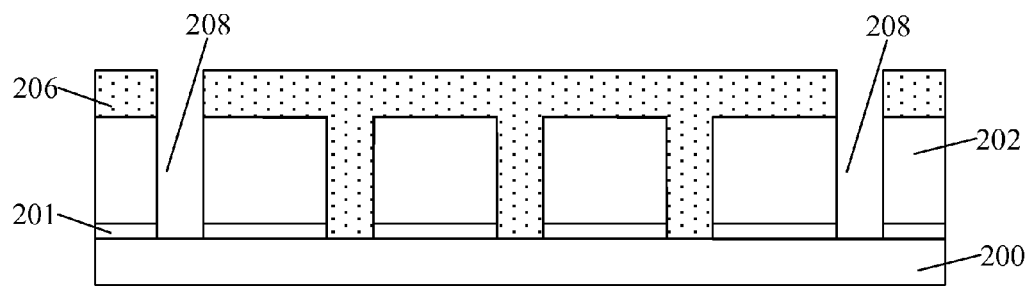

Further, as shown in FIG. 12, after forming the first initial conductive film 206, a plurality of second through holes 208 may be formed in dielectric layer 202. Further, the second through holes 208 may also penetrate through the first initial conductive film 206. A second conductive via may be subsequently formed in the each of the second through holes 208.

The plurality of second through holes 208 may be formed by etching the first initial conductive film 206 and the dielectric layer 202. A process for forming the second through holes 208 may include forming a second patterned mask layer on the first initial conductive film 206. The second patterned mask layer may define the size and positions of the subsequently formed second conductive vias. Further, the process may also include etching the first initial conductive film 206 and the dielectric film 202 using the second patterned mask layer as an etching mask until the surface of the substrate 200 is exposed. Thus, the second through holes 208 may be formed. After forming the second through holes 208, the second patterned mask layer may be removed.

The second patterned mask layer may be made of any appropriate material, such as silicon nitride, silicon oxide, photoresist, or silicon oxynitride, etc. Various processes may be used to form the second patterned mask layer, such as a CVD process, a PVD process, or an ALD process, etc. The first conductive film 206 and the dielectric layer 202 may be etched by any appropriate process, such as a dry etching process, a wet etching process, or an ion beam etching process, etc. The second patterned mask layer may be removed by any appropriate process, such as a dry etching process, a wet etching process, or a plasma ashing process, etc.

Figure 13:
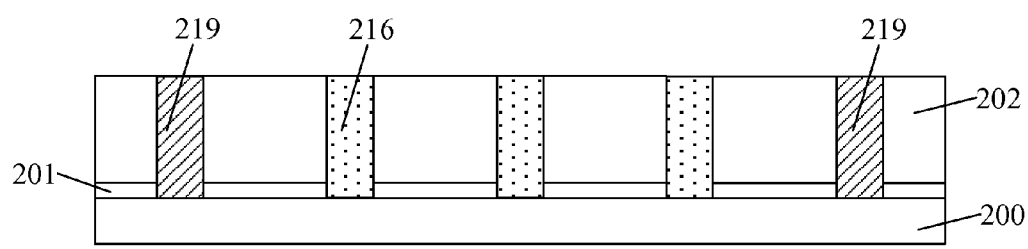

Further, as shown in FIG. 13, after forming the second conductive holes 208, a second conductive via 219 is formed in each of the second through holes 208; and a first conducive via 216 is formed in each of the first through holes 205. The top surfaces of the second conductive vias 219 may level with the top surfaces of the first conductive vias 216 and the surface of the dielectric layer 202.

A process for forming the first conductive vias 216 and the second conductive vias 219 may include forming a second initial conductive film (not shown) on the first initial conductive film 206. The second initial conductive film may also fill the second through holes 208. Further, the process may also include planarize the first initial conductive film 206 and the second initial conductive film until the surface of the dielectric film 202 is exposed. Thus, the first conductive vias 216 and the second conductive vias 219 may be formed.

In one embodiment, the second conductive vias 219 may be configured as portions of the subsequently formed second conductive structures. The second conductive structures may be configured as the power lines of the semiconductor structure. Thus, it may require the material of the second conductive vias 219 to have a relatively high anti-electromigration ability. In one embodiment, the second conducive vias 219 may be made of copper.

The second initial conductive film may be formed by any appropriate process, such as a CVD process, a PVD process, an FCVD process, or an electroplating process. In one embodiment, the second initial conductive film may be formed by an amber PVD process. In the amber PVD process, under the capillary action, copper may be sucked into the second through holes 208; and may reach the bottoms of the second through holes 208. Thus, copper in the second through holes 208 may fill the second through holes 208 with a bottom-up mode, and without defects. Therefore, it may avoid forming voids and defects on the bottom of the second through holes 208. Further, a smaller size of the second through holes 208 may have a more obvious capillary action. The more obvious capillary action may cause the copper filled the second through holes 208 to have a better quality. Thus, it may match the requirements of the device miniaturization.

The second initial conducive film and the first initial conductive film 206 may be planarized by any appropriate process, such as a CMP process, or a physical mechanical polishing process, etc. In one embodiment, a CMP process is used to planarize the second initial conductive film and the first initial conductive film 206.

In one embodiment, the first initial conductive film 206 may be formed first. In certain other embodiments, a plurality of first through holes and a plurality of the second holes may be formed in the dielectric layer 202 first. Then, the first initial conductive film may be formed on the dielectric layer 202. The first initial conductive film may fill the first through holes and the second through holes. After forming the first initial conductive film, the portion of the first initial conductive film in the second through holes may be removed. Then, a second initial conductive film may be formed on the first initial conductive film. The second initial conductive film may also fill the second through holes. Then, a CMP process may be used to planarize the first initial conductive film and the second initial conducive film until the surface of the dielectric layer is exposed.

Figure 14:
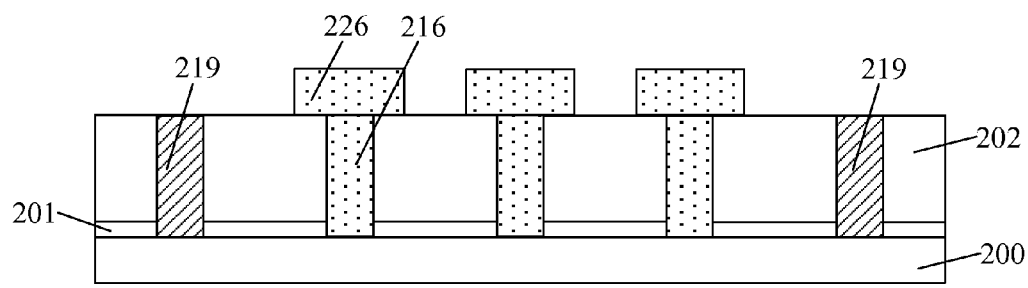

Further, as shown in FIG. 14, after forming the first conductive vias 216 and the second conductive vias 219, a first conductive line 226 is formed on each of the first conductive vias 216. The first conducive lines 226 may also cover a portion of the surface of the dielectric layer 202. A first conductive via 216 and the first conductive line 216 formed on the first conducive via 216 may form a first conducive structure (not labeled).

A process for forming the first conductive lines 226 may include forming a first line film (not shown) on the surface of the dielectric layer 202, the surfaces of the first conductive vias 216, and the surfaces of the second conductive vias 219; and followed by etching a portion of the first line film. Thus, the first conductive lines 226 may be formed.

Various processes may be used to form the first line film, such as a CVD process, a PVD process, or an ALD process, etc. The first line film may be etched by any appropriate process, such as a dry etching process, a wet etching process, or an ion beam etching process, etc.

The process for forming the first conductive lines 226 may be referred as a subtractive process. The grain size of the first conductive lines 226 formed by the subtractive process may be relatively large. Thus, the grain boundary scattering may be reduced; and the resistivity of the first conductive lines 226 may be reduced. Therefore, the performance of the semiconductor structure having such first conductive lines may be enhanced.

The first conductive structures may be configured as the signal lines of the semiconductor structure. Thus, the first line film may be made of aluminum or tungsten. That is, the first conductive lines 226 may be made of aluminum or tungsten; and the first conductive vias 216 may be made of aluminum or tungsten. Thus, the first conductive structures having the first conductive vias 216 and the first conductive lines 226 may be made of aluminum or tungsten. The first conductive structures made of aluminum or tungsten may match the requirements of anti-electromigration ability of interconnect structure. Further, comparing with the semiconductor structure having the signal lines made of copper, the production cost of the semiconductor structure having the signal lines made of aluminum or tungsten may be reduced.

Figure 15:
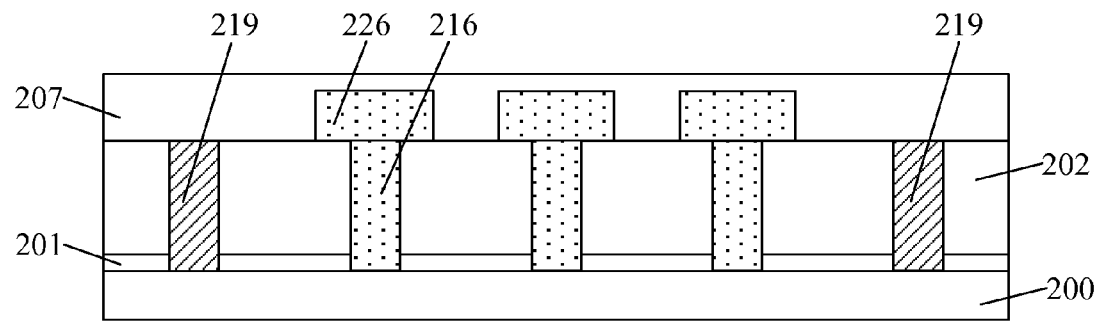

Further, as shown in FIG. 15, after forming the first conductive lines 226, an insulation layer 207 may be formed on the surface of the dielectric layer 202, and the surfaces of the second conductive vias 219. Further, the insulation layer 207 may also cover the top surfaces and the side surfaces of the first conductive lines 226.

The insulation layer 207 may be made of any appropriate material, such as silicon oxide, silicon nitride, or silicon oxynitride, etc. In one embodiment, the insulation layer 207 is made of carbon-doped silicon oxide (black diamond, BD). Various processes may be used to form the insulation layer, such as a CVD process, a PVD process, an ALD process, or a spin-coating process, etc. In one embodiment, the insulation layer 207 made of BD is formed by a spin-coating process. Thus, the insulation layer 207 may be referred as a spin-on BD layer 207.

Figure 16:
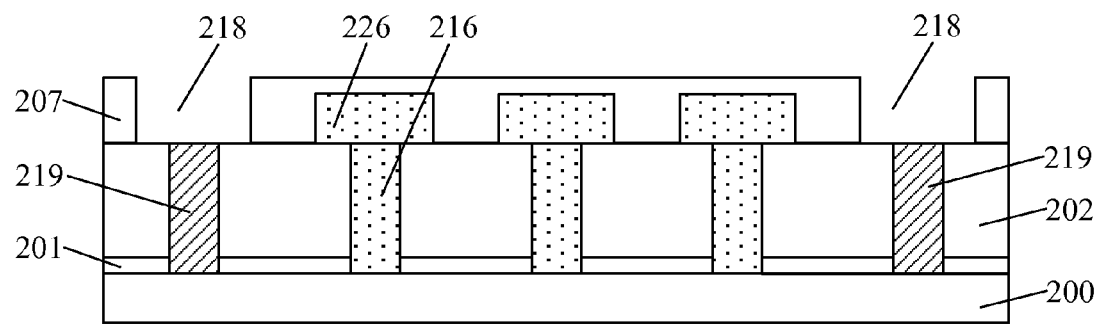

Further, as shown in FIG. 16, after forming the insulation layer 207, a trench 218 may be formed in the insulation layer 207 on each of the second conductive vias 219. That is, the trenches 218 may expose portions of the surface of the dielectric layer 202 and the top surfaces of the second conductive vias 219. The width of the trenches 218 may be greater than the width of the second conductive via 219. A second conductive line may be subsequently formed in each of the trenches.

The trenches 218 may be formed by etching the insulation layer 207. Various processes may be used to etch the insulation layer 207, such as a dry etching process, a wet etching process, or an ion beam etching process, etc. In one embodiment, a dry etching process may be used to etch the insulation layer 207 to form the trenches 218.

Figure 17:
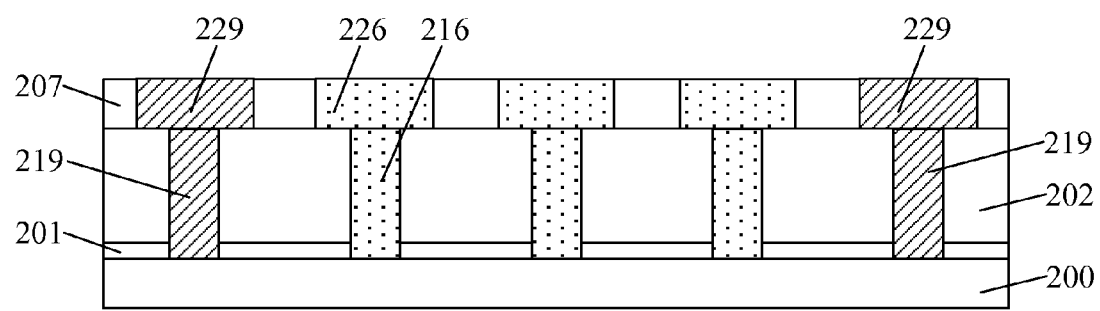

Further, as shown in FIG. 17, after forming the trenches 218, a second conductive line 229 may be formed in each of the trenches 218. The second conductive lines 229 may cover a portion of the surface of the dielectric layer 202; and the entire top surfaces of the second conductive vias 219. The top surfaces of the second conductive lines 229 may level with the top surfaces of the first conductive lines 216 and the top surfaces of the insulation layer 207. One second conductive via 219 and the second conductive line 229 formed on the second conductive via 219 may form a second conductive structure.

In one embodiment, the second conductive structures may be configured as the power lines of the semiconductor structure; and the first conductive structures may be configured as the signal lines of the semiconductor structure. Thus, the anti-electromigration ability of the first conductive structures may be different from the anti-electromigration ability of the second conductive structures. Specifically, in order to cause the material of the second conductive structures to have a relatively high anti-electromigration ability; and prevent the electromigration issue in the semiconductor structure, in one embodiment, the anti-electromigration ability the second conductive structures may be greater than the anti-electromigration ability of the first conductive structures. That is, the material of the second conductive structures may have a relatively large anti-electromigration ability. Thus, in one embodiment, the second conductive structures may be made of copper. That is, the second conductive lines 209 may be made of copper.

A process for forming the second conductive lines 229 may include forming a second initial line film on the insulation layer 207. The second initial line film may also fill the trenches 218. Then, the second initial line film and the insulation layer 207 may be planarized until the top surfaces of the first conductive lines 226 are exposed.

Various processes may be used to form the second initial line film, such as a CVD process, a PVD process, or an electroplating process, etc. In one embodiment, an amber PVD process is used to form the second initial line film. The second initial line film may be planarized by any appropriate process, such as a CMP process, or physical mechanical polishing process, etc.

In certain other embodiments, after forming the first conductive vias 216 and the second conductive vias 219, a process for forming the first conductive lines and the second conductive lines may include forming an insulation layer on the surfaces of the first conductive vias 216, the surfaces of the second conductive vias 219, and surface of the dielectric layer 202; etching the insulation layer to expose the top surfaces of the first conductive vias 216 to form first trenches; forming first conducive lines in the first trenches; etching the insulation layer to expose the top surfaces of the second conductive vias 219 to form second trenches; and forming second conductive lines in the second trenches. The top surfaces of the second conductive lines may level with the top surfaces of the first conductive lines and the top surface of the insulation layer.

In still certain other embodiments, a process for forming the first conductive structures and the second conductive structures may include providing a substrate; forming a dielectric layer on the substrate; and forming an insulation layer on the dielectric layer. Further, the process may include etching the insulation layer and the dielectric layer to form a plurality of first trenches in the insulation layer and a plurality of first through holes on the bottom of the first trenches in the dielectric layer to expose the surface of the substrate. The width of the first trenches may be greater than the size of the first through holes.

Further, the process may include forming a first conductive via in each of the first through holes; and a first conductive lines in each of the first trenches. One first conductive via and the one first conductive line formed on the first conductive via may form a first conductive structure. The first conductive vias may be made of aluminum or tungsten. The first conductive lines may be made of aluminum or tungsten. Further, after forming the first conductive structures, the insulation layer and the dielectric layer may be etched to form a plurality of second trenches in the insulation layer and a plurality of second through holes on the bottom of the second trenches in the dielectric layer to expose the surface of the substrate. The width of the second trenches may be greater than the width of the second through holes.

Further, after forming the second trenches and the second through holes, a second conductive via may be formed in each of the second through holes; and a second conductive line may be formed in each of the second trenches. The second conductive vias and the second conductive lines may be made of copper. Each of the second conductive vias and the second conducive line formed on the second conducive via may form a second conductive structure.

Therefore, according to the disclosed methods and structures, the power lines of the semiconductor structure may be made of copper; and the signal lines of the semiconductor structure may be made of aluminum or tungsten. Because the cost of aluminum or tungsten may be significantly lower than the cost of copper, the production cost of the semiconductor structure may be reduced. Further, copper may match the material requirements of the anti-electromigration ability for the power lines of the semiconductor structure; and aluminum or tungsten may match the material requirements of the anti-electromigration ability for the signal lines of the semiconductor structure. Thus, when the production cost of the semiconductor structure is reduced, the required electrical properties of the semiconductor structure may be ensured.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate;
   forming a dielectric layer covering a surface of the substrate;
   forming a plurality of first through holes exposing the surface of the substrate by etching the dielectric layer using a first patterned mask layer;
   forming first conductive vias by filling the plurality of first through holes using a first metal material and forming first conductive lines over the first conductive vias also using the first metal material;
   forming a plurality of second through holes exposing the surface of the substrate by etching the dielectric layer using a second patterned mask layer; and
   forming second conductive vias by filling the plurality of second through holes using a second metal material, different from the first metal material, and forming second conductive lines over the second conductive vias also using the second metal material, wherein:
   the anti-electromigration ability of the second metal material is greater than the anti-electromigration ability of the first metal material;
   the first conductive vias and the first conductive lines are configured as signal lines of the semiconductor structure; and
   the second conductive vias and the second conductive lines are configured as power lines of the semiconductor structure.

2. The method according to claim 1, wherein:
   the first metal material is one of aluminum and tungsten; and
   the second metal material is copper.

3. The method according to claim 2, wherein:
   the second conductive vias and the second conductive lines are formed by a flowable physical vapor deposition process; and
   the flowable physical vapor deposition process includes an amber physical vapor deposition process.

4. The method according to claim 3, wherein forming the second conducive vias and the second conductive lines further:
   forming a copper film on the dielectric layer; and
   performing the amber vapor deposition process to cause copper atoms to reach bottoms of the second through holes under an capillary action until the second through holes are filled.

5. The method according to claim 2, wherein forming the first conducive vias and the first conductive lines further includes:
   forming a first conductive film on the first dielectric layer after forming the plurality of the first through holes;
   patterning the first conductive film to form the first conductive vias in the dielectric layer and the first conductive lines on the first conductive vias covering a portion of the surface of the dielectric layer.

6. The method according to claim 5, after forming the first conductive vias and the first conductive lines and before forming the second conductive vias and the second conductive lines, further including:
   forming an insulation layer covering the surface of the dielectric layer and side surfaces of the first conductive lines.

7. The method according to claim 6, wherein forming the second conductive vias and the second conductive lines further includes:

etching the insulation layer and the dielectric layer to form a plurality of second trenches in the insulation layer and second through holes with a width smaller than a width of the second trenches on bottoms of the second trenches in the dielectric layer to expose the surface of the substrate; and forming second conductive vias in the second through holes and second conductive lines on the second conductive vias in the second trenches with a top surface leveling with top surfaces of the first conductive lines.

8. A method for fabricating a semiconductor structure, comprising:
providing a substrate;
forming a dielectric layer covering a surface of the substrate;
forming a plurality of first through holes exposing the surface of the substrate by etching the dielectric layer using a first patterned mask layer;
forming first conductive vias by filling the plurality of first through holes using a first metal material and first conductive lines over the first conductive vias also using the first metal material;
forming a plurality of second through holes exposing the surface of the substrate by etching the dielectric layer using a second patterned mask layer; and
forming second conductive vias by filling the plurality of second through holes using a second metal material, different from the first metal material, and second conductive lines over the second conductive vias also using the second metal material, wherein:
the second metal material has a different anti-electromigration ability from the first metal material;
the second conductive vias are formed after forming the first conductive via and before forming the first conductive lines; and
the first conductive lines are formed after forming the second conductive vias and before forming the second conductive lines.

9. The method according to claim 8, wherein forming the first conductive lines further includes:
forming a first initial line film on a surface of the dielectric layer and top surfaces of the first conductive vias; and
etching a portion of the first initial line film on the dielectric layer to form the first conductive lines on the first conductive vias and a portion of the dielectric layer.

10. The method according to claim 9, wherein forming the second conductive lines further includes:
forming an insulation layer covering the surface of the dielectric layer, surfaces of the second conductive vias and side surfaces of the first conducive lines;
etching the insulation layer to expose the top surfaces of the second conductive vias to form second trenches exposing the second conductive vias in the insulation layer; and
forming second conductive lines on the second conductive vias in the second trenches.

11. The method according to claim 8, wherein forming the second conductive lines further includes:
forming an insulation layer on the surface of the dielectric layer, top surfaces of the plurality of first conductive vias; and top surfaces of the plurality of second conductive vias;
etching the insulation layer to expose the top surfaces of the first conductive vias;
forming first conductive lines on the first conductive vias in the first trenches;

etching the insulation layer to expose the top surfaces of the second conductive vias; and
forming second conductive lines on the first conductive vias in the second trenches.

12. The method according to claim 2, before forming the first conductive conductive vias, the first conductive lines, the second conductive vias and the second conductive lines, further including:
forming an insulation layer on the dielectric layer.

13. The method according to claim 12, wherein forming the first through holes, the first conductive vias, and the first conductive lines further includes:
etching the insulation layer and the dielectric layer to form a plurality of first trenches in the insulation layer and a plurality of first through holes with a width smaller than a width of the first trenches on bottoms of the first trenches in the dielectric layer to expose the surface of the substrate; and
forming first conducive vias in the first through holes and first conducive lines on the first conductive vias in the first trenches.

14. The method according to claim 13, wherein forming the second through holes, the second conductive vias, and second conductive lines further includes:
etching the insulation layer and the dielectric layer to form a plurality of second trenches in the insulation layer and second through holes with a width smaller than a width of the second trenches on bottoms of the second trenches to expose the surface of the substrate; and
forming second conducive vias in the second through holes and second conducive lines on the second conductive vias in the second trenches.

15. A semiconductor structure, comprising:
a substrate;
a dielectric layer formed on a surface of the substrate;
a plurality of first conducive vias made of a first metal material formed on the surface of the substrate in the dielectric layer and a plurality of first conductive lines also made of the first metal material formed on the first conducive vias; and
a plurality of second conductive vias made of a second metal material, different from the first metal material, formed on the substrate in the dielectric layer and a plurality of second conductive vias also made of the second metal material formed on the second conductive vias, wherein, the first metal material has an anti-electromigration ability different from the second metal material;
the first conductive vias and the first conductive lines are formed by a subtractive patterning process; and
the second conductive vias and the second conductive lines are formed by an amber physical vapor deposition process.

16. The semiconductor structure according to claim 15, wherein:
the anti-electromigration ability of the second metal material is greater than the anti-electromigration ability of the first metal material;
the first conductive vias and the first conductive lines are configured as signal lines of the semiconductor structure;
the second conductive vias and the second conducive lines are configured as power lines of the semiconductor e structure;
the first conductive vias and the first conductive lines are made of one of aluminum and tungsten; and the second conducive vias and the second conductive lines are made of copper.

17. The semiconductor structure according to claim 15, wherein:
the dielectric layer is made of one of silicon oxide, silicon nitride, silicon oxynitride, low dielectric constant material, and ultra-low dielectric constant material.

18. The semiconductor structure according to claim 15, further including:
an insulation layer covering side surfaces of the first conductive lines and side surfaces of the second conductive lines formed on the surface of the dielectric layer.

* * * * *